United States Patent [19]

Satoh

[11] Patent Number: 5,049,959
[45] Date of Patent: Sep. 17, 1991

[54] SEMICONDUCTOR INTEGRATED CIRCUIT DEVICE

[75] Inventor: Shinichi Satoh, Itami, Japan

[73] Assignee: Mitsubishi Denki Kabushiki Kaisha, Tokyo, Japan

[21] Appl. No.: 526,943

[22] Filed: May 21, 1990

Related U.S. Application Data

[63] Continuation of Ser. No. 232,551, Aug. 15, 1988, abandoned, which is a continuation of Ser. No. 47,607, May 1, 1987, abandoned, which is a continuation of Ser. No. 694,322, Jan. 24, 1985, abandoned.

[30] Foreign Application Priority Data

Apr. 17, 1984 [JP] Japan ................... 59-78928

[51] Int. Cl.[5] ............... H01L 29/68; H01L 29/06; H01L 27/02
[52] U.S. Cl. .................... 357/23.6; 357/55; 357/51
[58] Field of Search ............ 357/23.6, 55, 51

[56] References Cited

U.S. PATENT DOCUMENTS

| | | | |
|---|---|---|---|
| 3,961,355 | 6/1976 | Abbas et al. ............ | 357/49 |
| 4,441,246 | 4/1984 | Redwine ............... | 29/571 |
| 4,688,063 | 8/1987 | Lu et al. .............. | 357/23.6 |
| 4,792,834 | 12/1988 | Uchida ................ | 357/23.6 |

FOREIGN PATENT DOCUMENTS

| | | | |
|---|---|---|---|
| 0085988 | 8/1973 | European Pat. Off. ......... | 357/23.6 |
| 0088451 | 9/1983 | European Pat. Off. ......... | 357/23.6 |
| 2318912 | 1/1974 | Fed. Rep. of Germany . | |
| 3414057 | 10/1984 | Fed. Rep. of Germany . | |
| 57-01252 | 1/1982 | Japan .................. | 357/23.6 |
| 57-45269 | 3/1982 | Japan .................. | 357/23.6 |
| 2114814 | 2/1982 | United Kingdom ........ | 357/23.6 |

OTHER PUBLICATIONS

*Electronics*, vol. 54, #13, pp. 103-105, by Rao, Jun. 30, 1981.
Sze, *Physics of Semiconductor Devices*, 1981, p. 32.
H. H. Chao et al., IBM Technical Disclosure Bulletin, vol. 26, No. 5 (10/83).
P. F. Landler, IBM Technical Disclosure Bulletin, vol. 17, No. 11 (4/75).
IBM Technical Disclosure Bulletin, vol. 26, No. 9, Feb. 1984, "Trench Node One-Device Memory Cell Process", by B. El-Kareh et al., pp. 4699-4701.

*Primary Examiner*—Mark Prenty
*Attorney, Agent, or Firm*—Lowe, Price, LeBlanc and Becker

[57] ABSTRACT

A semiconductor integrated circuit device having at least one capacitor comprises a first semiconductor layer (9) having a relatively high impurity concentration and a second semiconductor layer (10) formed on said first semiconductor layer and having a relatively low impurity concentration of the same conductivity type as that of said first semiconductor layer. The capacitor is formed with a groove (15) extending at least up to an interface between the first semiconductor layer (9) and the second semiconductor layer (10) and the capacitor electrode (5) extends along the groove (15), so that a storage capacitance of the capacitor can be increased.

7 Claims, 2 Drawing Sheets

FIG. 3B
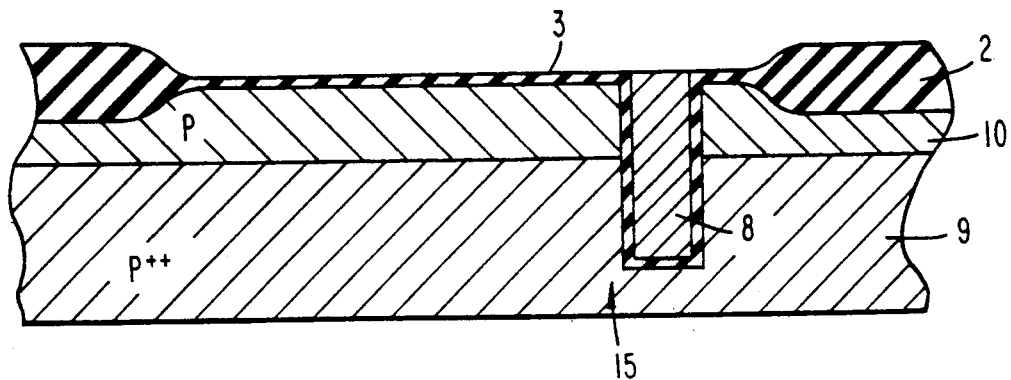
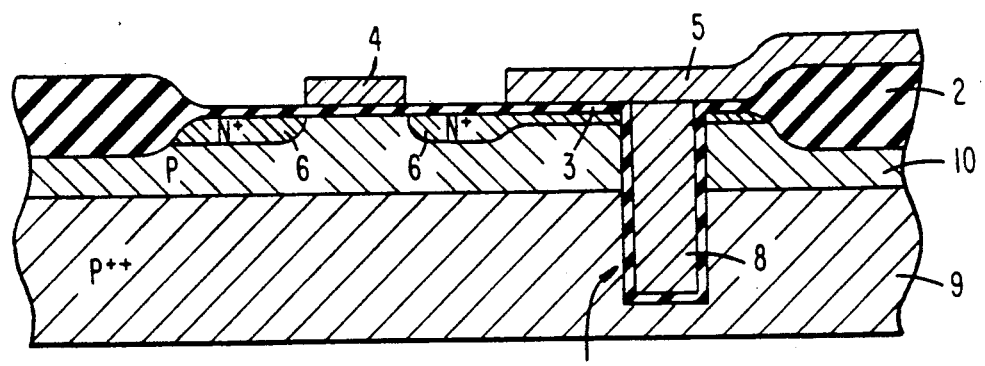
FIG. 3C
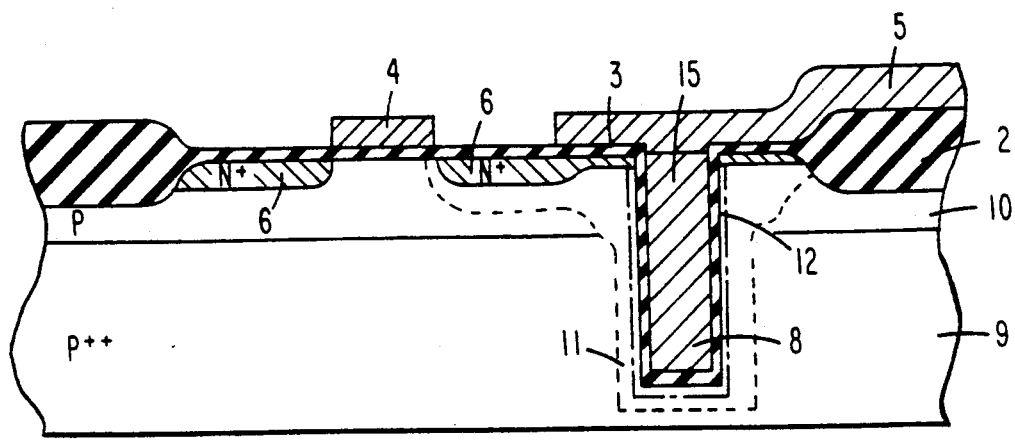
FIG. 4

SEMICONDUCTOR INTEGRATED CIRCUIT DEVICE

This application is a continuation of application Ser. No. 07/232,551 filed Aug. 15, 1988 and now abandoned, which is a continuation of application Ser. No. 07/047,607 filed May 1, 1987 and now abandoned, which is a continuation of application Ser. No. 06/694,322 filed Jan. 24, 1985 and now abandoned.

BACKGROUND OF THE INVENTION

1. Field of the Invention

The present invention relates to a semiconductor integrated circuit device and, more particularly, relates to a semiconductor integrated circuit device having a capacitor portion, such as a dynamic random access memory (DRAM), capable of increasing charge storage capacitance of the capacitor portion.

2. Description of the Prior Art

In recent years, in a semiconductor integrated circuit device, particularly, in a dynamic random access memory of a single transistor and single capacitor type, as a circuit pattern is fined due to a high integration, an area for a capacitor is decreased, which causes a problem of a soft error, defective circuit margin, and the like due to decrease of charge storage capacitance in the capacitor portion. Many countermeasures have been taken so as to cope with these problems.

FIG. 1 is a diagram showing a sectional structure of a memory capacitor portion of a conventional dynamic random access memory. In FIG. 1, a thick oxide film 2 for separation between devices is formed on a P-type of silicon semiconductor substrate 1, so that adjacent devices are electrically insulated from each other. The dynamic random access memory includes at least one transistor portion and at least one capacitor portion. The transistor portion includes an N+ diffused layer 6 to be source and drain formed in a predetermined region on the P-type of semiconductor substrate 1 and a gate electrode 4 formed in a gate area of the P-type of semiconductor substrate 1 through a thin oxide layer 3. On the other hand, the capacitor portion includes the P-type of semiconductor substrate 1, the thin oxide layer 3 for storing an electric charge indicative of information, and a capacitor electrode 5 formed on a predetermined region over the thin oxide layer 3.

Writing and reading of a storage charge (information) are made in response to a voltage applied to the gate electrode 4, in which case the N+ diffused layer 6 for the source and drain serves as a path for the storage charge.

In the above described structure, if and when a circuit pattern is further fined, it is clear that the area for capacitor decreases and hence the charge storage capacitance in the capacitor also decreases. In order to prevent such decrease of the storage capacitance, it may be considered that the thickness of a thin oxide film 3 is made thinner so that the storage capacitance can be increased. However, in such a case, there is a limit that the thickness of the oxide film 3 can be made further thinner, due to limit of the breakdown voltage and the like of the gate oxide film.

Therefore, in order to increase capacitance, as shown in the dotted line in FIG. 1, it has been attempted that the P+ type of semiconductor layer 7 having high impurity concentration is formed in the silicon semiconductor substrate 1 so that the p-n junction is formed between the thin oxide film 3 and P+ type of layer 7, thereby to increase a charge storage capacitance. However, even in such a structure, if and when the area for capacitor decreases, the area of the p-n junction also decreases, and hence much more increase of charge storage capacitance can not be expected.

In order to eliminate the defect of the above described structure, the approach for increasing storage capacitance has been made by forming a deep groove in a semiconductor substrate for forming a capacitor. Such a concept is described by H. Sunami et al., "A CORRUGATED CAPACITOR CELL (CCC) FOR MEGABIT DYNAMIC MOS MEMORIES", IEDM'82 Digest, p806–808.

FIG. 2 is a drawing showing a sectional structure of a conventional improvement of a memory capacitor portion of a dynamic random access memory. Referring to FIG. 2, such structure will be described. First of all, a deep groove is formed in a region of a P-type of silicon semiconductor substrate 1, which corresponds to the area to be a capacitor, and then, the substrate 1 and the surface of the groove are covered with a thin oxide film 3. Thereafter, the groove is filled with a polycrystal silicon layer 8, for example, so that a capacitor electrode 5 is formed on an area on the groove. Accordingly, the polycrystal silicon layer 8 serves as a capacitor electrode. In such a structure, since a deep groove is formed in the substrate 1, the surface area of the groove also serves as the area for capacitor and hence the total area for capacitor can be increased. However, even in such a case, due to a breakdown voltage of a thin oxide film 3 formed on the surface of the groove, the thickness of the oxide film 3 should be made thicker than a thickness of a usual oxide film. Therefore, even if a relatively deep groove is formed so that the surface area is increased, it was still difficult to fully increase charge storage capacitance.

As described in the foregoing, mere reliance on the conventional structure can not fully compensate for decrease of charge storage capacitance accompanied by decrease of capacitor area due to a further fining of a circuit pattern.

SUMMARY OF THE INVENTION

A primary object of the present invention is to provide a semiconductor integrated circuit device which can eliminate the above described defects so that a soft error, a defection of circuit margin and the like never occur.

Briefly stated, the present invention is directed to a semiconductor integrated circuit device having at least one capacitor portion, comprising a first semiconductor layer of a first conductivity type having high impurity concentration, a second semiconductor layer of said first conductivity type having low impurity concentration, deposited on said first semiconductor layer and a groove formed in an area corresponding to said capacitor portion of said first and second semiconductor layers, said groove reaching at least the interface of said first and second semiconductor layers and serving as a capacitor electrode. As a result, the junction capacitance in the p-n junction portion formed in the surrounding of said groove enable increase of charge storage capacitance of the capacitor portion.

Preferably, the first semiconductor layer is a P++ type of semiconductor layer having an impurity concentration of $1 \times 10^{16} - 1 \times 10^{21}/cm^3$ and the second semiconductor layer is a P-type of semiconductor layer having an impurity concentration of $1\times10^{14}$–$1\times10^{16}$ cm$^3$ and a thickness of 2–3 μm. However, as can be easily appreciated, it is possible to apply the present invention to a case where a conductivity type of a semiconductor layer is an N-type.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 3A, 3B and 3C are sectional views showing a process of a dynamic random access memory having a groove region, which is an embodiment of the present invention; and FIG. 4 is a drawing schematically showing an N layer and a depletion layer formed in the periphery of the capacitor electrode in operation of the capacitor portion in FIG. 3C.

DESCRIPTION OF THE PREFERRED EMBODIMENTS

Figure 1:
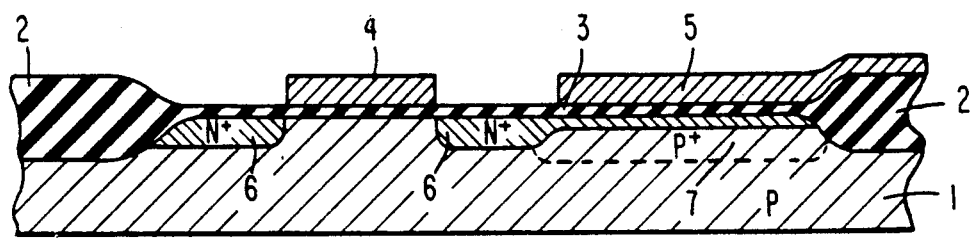
FIG. 1 is a cross sectional view of a memory capacitor of a conventional dynamic random access memory.
Figure 2:
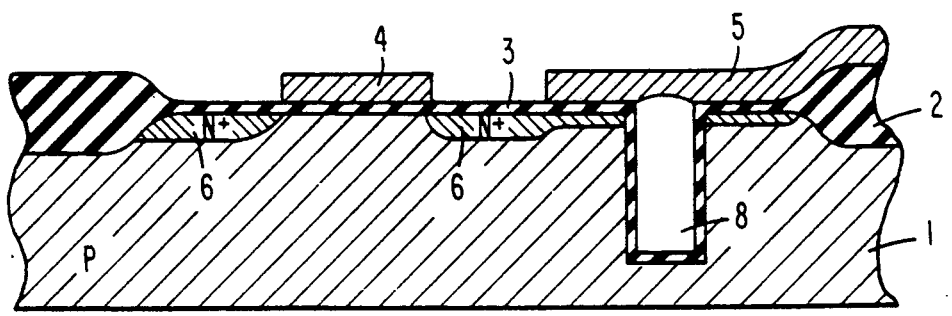
FIG. 2 is a cross sectional view of a memory capacitor of another conventional dynamic random access memory having a groove region.
Figure 3A:
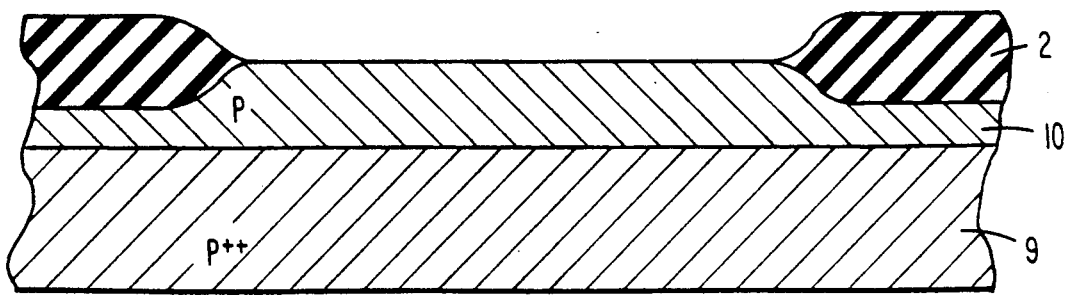

FIGS. 3A, 3B and 3C show a cross sectional structure of a dynamic random access memory of an embodiment of the present invention, which are illustrated in order of processes. In FIG. 3A, a silicon semiconductor substrate includes a P++ substrate 9 having high impurity concentration of $1\times10^{16}$–$1\times10^{21}$/cm$^3$, a P-type of semiconductor layer 10 having low impurity concentration of $1\times10^{14}$–$1\times10^{16}$/cm$^3$ which is formed on the substrate 9 and has a thickness of 2–3 μm, and thick oxide film 2 of SiO$_2$ for isolation, which is formed by a conventional process. Then, in FIG. 3B, a groove having a depth of 4–5 μm is formed in an area of the silicon substrate corresponding to the capacitor electrode, by means of a conventional plasma etching and the like, so that a thin oxide film 3 is formed over the surface of said groove and said silicon semiconductor substrate. Thereafter, the groove is filled with a polycrystal silicon layer 8, for example, by means of a conventional process, so that a trench region 15, the surface of which is flat, is formed. In addition, in FIG. 3C, an N+ diffused region 6 for source and drain, a gate electrode 4 and a capacitor electrode 5 are formed, so that a single transistor—a single capacitor type of memory cell is formed. The polycrystal silicon film 8 which the groove is filled with achieves the same function as that of the capacitor electrode 5.

Meanwhile, we will describe the reason why the impurity concentration of a surface layer 10 is selected to be $1\times10^{14}$–$1\times10^{16}$/cm$^3$. More particularly, if and when the impurity concentration of the surface layer 10 is uniformly larger than $1\times10^{16}$/cm$^3$, an unnecessary additional capacitance formed by a bit line and a surface layer, for example, is produced in a dynamic random access memory, for example, which results in much disadvantage against a high speed operation thereof. Therefore, the impurity concentration of the surface layer is made lower, such as $1\times10^4$–$1\times16$/cm$^3$, so that the above described disadvantage may be eliminated. At this time, a threshold voltage control of an MOS transistor is made by a partial ion implantation.

Furthermore, we will describe the reason why the concentration of a semiconductor substrate 9 is selected to be $1\times10^{16}$–$1\times10^{21}$/cm$^3$ is that a P-N junction is formed in the side portion and bottom portion of the trench region, so that the storage capacitance in the capacitor portion can be increased by using such junction capacitance. Another reason is to prevent a soft error caused due to α particles. More particularly, in case where a P++ type of semiconductor substrate of high impurity concentration is used, even if an electron, which is a cause of a soft error, is generated due to α particles in the P++ type of semiconductor substrate, the electron flows through only the P++ semiconductor substrate and a hole associated with this electron is absorbed by a P-type of semiconductor layer having low impurity, and hence a soft error can be prevented from being caused.

Referring to FIG. 4, we will consider a capacitor portion when an electric charge is stored in a memory cell having the above described structure. In this case, in the semiconductor substrate, an N layer 12, which is surrounded by a chain line in FIG. 4, and a depletion layer 11, which is surrounded by a dotted line in FIG. 4, are formed along a thin oxide film 3. As a result, both of a capacitance formed by the thin oxide film 3 between the capacitor electrode 5 and the electrode corresponding portion 8 and the N layer 12, and a junction capacitance formed by the depletion layer 11 between the N layer 12 and the P layer 10 and P++ type of substrate 9 contribute to charge storage capacitance in the capacitor portion, resulting in much increase as compared with a conventional apparatus. As a result, unlike a conventional planar type of capacitor, a surface area of the trench region 15 is not so decreased (a surface area of the side surface is extremely larger than that in the top and bottom surfaces) and hence the storage capacitance of the capacitor is not so decreased, even if a circuit pattern is further fined. Accordingly, even if a circuit pattern is further fined, a dynamic random access memory having a stable operation can be obtained.

Although a dynamic random access memory having a P-type of semiconductor substrate was described in the above described embodiment, the concept of the present invention can be applied to a dynamic random access memory having an N-type of semiconductor substrate and a well structure in a complementary metal oxide semiconductor device and the like, so that junction capacitance can be increased. However, in case where the present concept is applied to a well region of a complementary metal oxide semiconductor device, the depth of the trench region must be made smaller than that in the well region.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device having at least one capacitor, comprising:
   a first semiconductor layer of a first conductivity type having a relatively high impurity concentration in a range of $1\times10^{16}$ through $1\times10^{21}$/cm$^3$;
   a second semiconductor layer of said first conductivity type having a thickness of at least 2 microns formed on said first semiconductor layer and having a relatively low impurity concentration in a range of $1 \times 10^{14}$ through $1 \times 10^{16}/cm^3$;

a groove having sidewall surface areas extending through said second semiconductor layer and into said first semiconductor layer;

an oxide layer formed on said sidewall surface areas of said groove;

a capacitor electrode in said groove bounded by said oxide layer lining said groove; and a third semiconductor layer of a second conductivity type surrounding said groove and a depletion layer surrounding said third semiconductor layer;

wherein a storage capacitance is formed between said capacitor electrode and said third semiconductor layer, a first junction capacitance is formed by the depletion layer between said third semiconductor layer and said first semiconductor layer and a second junction capacitance is formed by the depletion layer between said third semiconductor layer and said second semiconductor layer.

2. A semiconductor integrated circuit device in accordance with claim 1, wherein said device includes memory cells each having a single transistor and a single capacitor.

3. A semiconductor integrated circuit device having at least one capacitor, comprising:

a first semiconductor layer of a first conductivity type having a relatively high impurity concentration in a range of $1 \times 10^{16}$ through $1 \times 10^{21}/cm^3$;

a second semiconductor layer of said first conductivity type having a thickness of at least 2 microns formed on said first semiconductor layer and having a relatively low impurity concentration in a range of $1 \times 10^{14}$ through $1 \times 10^{16}/cm^3$;

a groove having sidewall surface areas extending perpendicular to the plane of an interface of said first and second semiconductor layers, an oxide layer formed on said sidewall surface areas of said groove;

a capacitor electrode in said groove bounded by said oxide layer lining said groove; and a third semiconductor layer of a second conductivity type surrounding said groove and a depletion layer surrounding said third semiconductor layer, said depletion layer being narrower in a portion proximate said first semiconductor layer than in a portion proximate said second semiconductor layer;

wherein a storage capacitance is formed between said capacitor electrode and said third semiconductor layer, a first junction capacitance is formed by the depletion layer between said third semiconductor layer and said first semiconductor layer and a second junction capacitance is formed by said the depletion layer between said third semiconductor layer and said second semiconductor layer.

4. A semiconductor integrated circuit device in accordance with claim 3, wherein said device includes memory cells each having a single transistor and a single capacitor.

5. A semiconductor integrated circuit device having at least one capacitor, comprising:

a first semiconductor layer of a first conductivity type having a relatively high impurity concentration of in a range of $1 \times 10^{16}$ through $1 \times 10^{21}/cm^3$;

a second semiconductor layer of said first conductivity type having a thickness of at least 2 microns formed on said first semiconductor layer and having a relatively low impurity concentration in a range of in a range of $1 \times 10^{14}$ through $1 \times 10^{16}/cm^3$;

a groove having sidewall surface areas extending through said second semiconductor layer and into said first semiconductor layer;

an oxide layer formed on said sidewall surface areas of said groove;

a capacitor electrode in said groove bounded by said oxide layer lining said groove; and a third semiconductor layer of a second conductivity type, formed in response to the application of a relatively high voltage to said capacitor electrode, surrounding said groove and a depletion layer surrounding said third semiconductor layer.

6. A semiconductor integrated circuit device in accordance with claim 5 wherein a storage capacitance is formed between said capacitor electrode and said third semiconductor layer, a first junction capacitance is formed by the depletion layer between said third semiconductor layer and said first semiconductor layer and a second junction capacitance is formed by said the depletion layer between said third semiconductor layer and said second semiconductor layer.

7. A semiconductor integrated circuit device in accordance with claim 6, wherein said device includes memory cells each having a single transistor and a single capacitor.

* * * * *